US006574103B1

(12) United States Patent
Hinterlong

(10) Patent No.: US 6,574,103 B1
(45) Date of Patent: Jun. 3, 2003

(54) ENCLOSURE WITH RF ISOLATION FOR CIRCUIT PACKS

(75) Inventor: Stephen Joseph Hinterlong, Kane County, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/094,472

(22) Filed: Mar. 8, 2002

(51) Int. Cl.[7] .................................................. H05K 7/20
(52) U.S. Cl. ...................... 361/692; 174/35 R; 361/800; 361/818; 439/607
(58) Field of Search ........................ 439/607; 174/35 R, 174/35 GC, 51, 16.1; 361/690, 691, 692, 695, 717–720, 796, 800, 816, 818; 211/41.17, 26; 454/184; 165/80.3

(56) References Cited

U.S. PATENT DOCUMENTS

| | | | | | |
|---|---|---|---|---|---|
| 4,408,255 A | * | 10/1983 | Adkins | ........................ | 361/689 |
| 5,504,657 A | * | 4/1996 | Bellino et al. | ............... | 361/800 |
| 5,923,219 A | * | 7/1999 | Ide et al. | ..................... | 330/308 |
| 6,313,997 B1 | * | 11/2001 | Speraw | ........................ | 361/741 |
| 6,349,041 B1 | * | 2/2002 | Hayward et al. | ........... | 361/818 |
| 6,381,147 B1 | * | 4/2002 | Hayward et al. | ........... | 361/756 |

* cited by examiner

Primary Examiner—Gerald Tolin

(57) ABSTRACT

An enclosure includes spaced apart sidewalls and a bottom wall, rear wall, and top cover each forming an RF tight seal with the sidewalls, and defining separate chambers for a plurality of circuit packs. The edges of the sidewalls, bottom wall and top cover at the entrance to each chamber are configured to form an RF tight seal with the faceplate of an installed circuit pack. A fluid for cooling the circuit pack enters each chamber and a baffle allows the fluid to escape while being resistant to the transmission of RF energy. Surfaces of the sidewalls that are interior to each chamber are able to disrupt and absorb a substantial portion of the RF energy radiating from the enclosed circuit pack and thereby minimize the level of RF energy within the chamber.

18 Claims, 3 Drawing Sheets

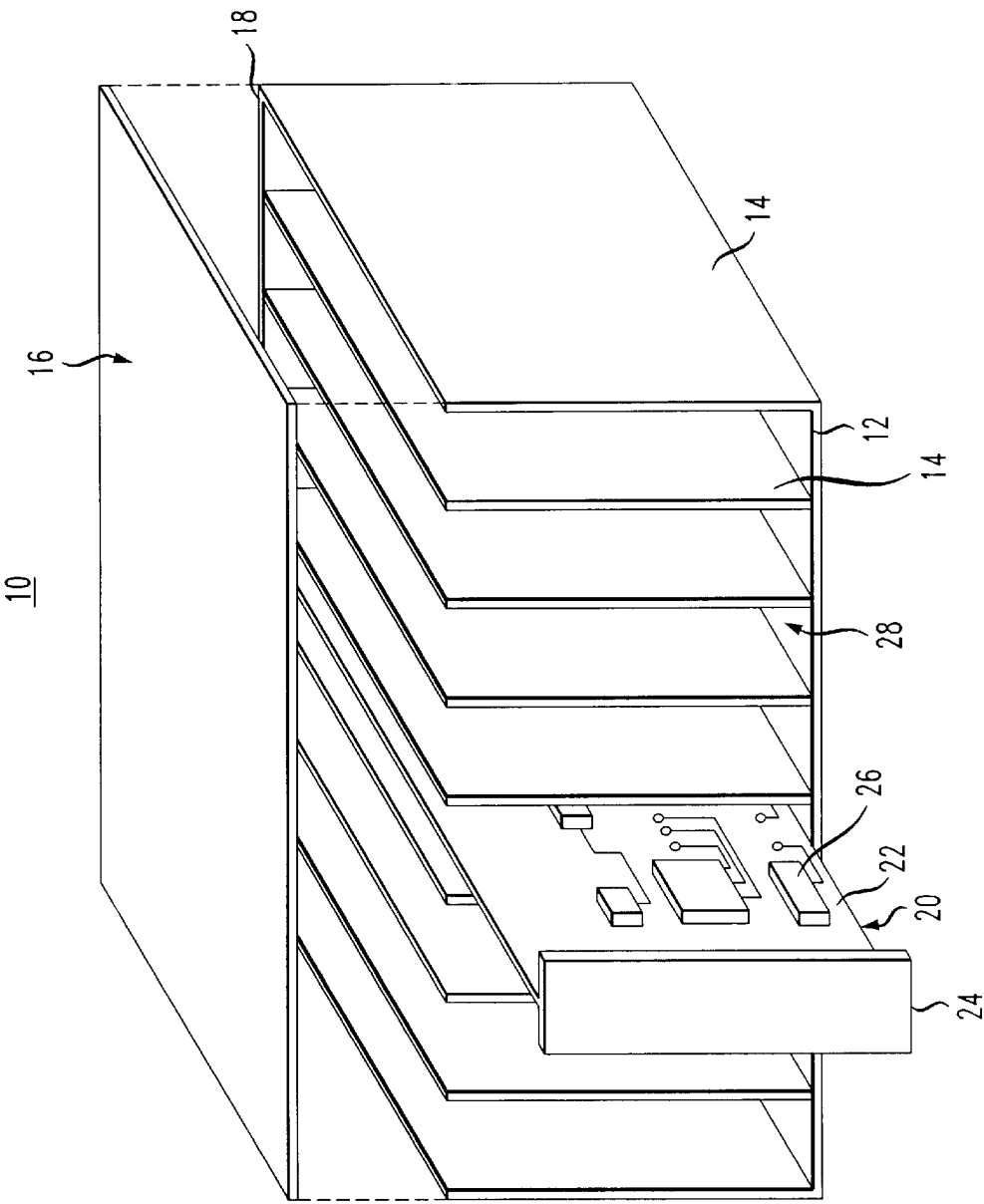

ENCLOSURE WITH RF ISOLATION FOR CIRCUIT PACKS

BACKGROUND

This invention generally relates to housings that hold a plurality of circuit packs and more specifically relates to housings that suppress radio frequency (RF) radiation generated by circuit packs contained therein.

Electronic circuit packs, also referred to as printed circuit boards, are widely used in various types of electronic equipment. Circuit packs typically support and connect electronic components including integrated circuits that operate as analog devices, digital devices, or RF components. The frequency of operation of the RF components continues to increase as technology permits higher frequencies of operation. Digital devices are also undergoing a similar evolution wherein clock speeds continue to increase, which is the equivalent of operating at higher frequencies. The tendency of components and conductors on the circuit packs to generate undesired RF radiation increases as the frequency of operation and clock speeds increase. The problem of undesired RF radiation is exacerbated by the desire to mount a plurality of circuit packs in relatively close proximity to each other in a cabinet in constructing complex electronic equipment. Excessive amounts of RF radiation from one circuit pack can adversely impact the operation of an adjacent circuit pack as well as causing undesired amounts of RF radiation to the external environment. It is difficult for the designers of circuit packs to substantially eliminate undesired RF radiation, especially where components on the circuit pack operate at higher frequencies or high clock speeds.

The design of enclosures for circuit pack is further complicated by the need to keep components on circuit packs from overheating. The amount of heat a component dissipates normally increases as the frequency of operation of the component increases. Thus, the need for additional cooling increases along with the undesired RF radiation levels with higher frequencies and clock rates.

A common design for an enclosure that houses a plurality of circuit packs uses a metal enclosure that surrounds the grouping of circuit packs that are plugged into a backplane that provides electrical connections to the circuit packs. The bottom and top planar walls of the metal enclosure are perforated to accommodate the flow of air generated by one or more fans. While such a design may be effective in minimizing undesired RF radiation to the external environment, undesired radiation among circuit packs in the enclosure is not effectively suppressed. RF radiation can create problems for a component on a circuit pack when the source of the radiation is another circuit pack and when the source of the radiation is another component on the same circuit pack. The internal reflection of RF radiation off walls of the enclosure can also cause problems. Therefore, there exists a need for an improved circuit pack enclosure that minimizes RF radiation problems inside as well as outside of the enclosure, while providing effective cooling for components on the circuit packs.

SUMMARY OF THE INVENTION

It is an object of the present invention to provide an enclosure that accommodates a plurality of circuit packs and minimizes RF radiation within the enclosure and to the external environment. A further object of the present invention is to provide effective cooling for components on the enclosed circuit packs while providing the improvement in minimizing RF radiation.

In accordance with an embodiment of the present invention, an enclosure includes spaced apart sidewalls and a bottom wall, rear wall, and top cover each forming an RF tight seal with the sidewalls, and defining separate chambers for a plurality of circuit packs. The edges of the sidewalls, bottom wall and top cover at the entrance to each chamber are configured to form an RF tight seal with the faceplate of an installed circuit pack. A connector engages the circuit pack and provides communication paths between the circuit pack and other equipment external to the enclosure. A fluid for cooling the circuit pack is input into each chamber and a means for allowing the fluid to escape is provided while being resistant to the transmission of RF energy. Surfaces of the sidewalls that are interior to each chamber are able to disrupt and absorb a substantial portion of the RF energy radiating from the enclosed circuit pack and thereby minimize the level of RF energy within the chamber.

In accordance with another embodiment of the present invention, a plurality of circuit packs each having an associated faceplate are used in combination with the above described chambers to form individual enclosures that provide RF isolation.

BRIEF DESCRIPTION OF THE DRAWINGS

FIG. 1 is a perspective view of an embodiment of an enclosure according to present invention.

DESCRIPTION OF PREFERRED EMBODIMENTS

Figure 3:
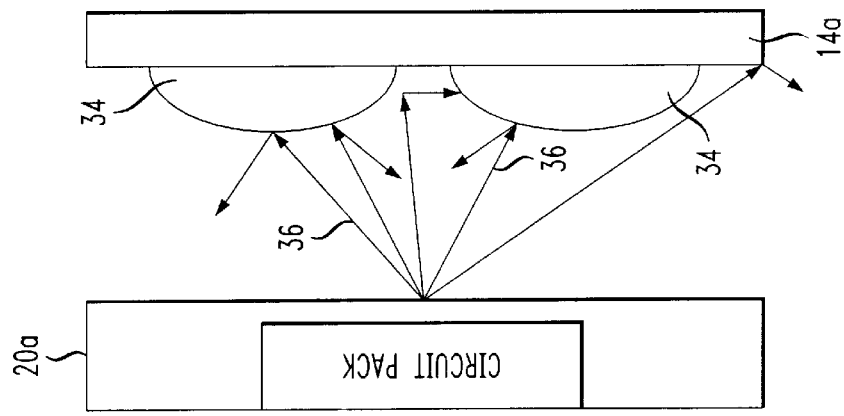
FIG. 3 is an exploded view of a section of FIG. 2.

FIG. 1 shows an embodiment of an enclosure 10 according to the present invention that includes a bottom wall 12, a plurality of sidewalls 14, a top cover 16, and rear wall 18. An illustrative circuit pack 20 includes a circuit board 22 and a faceplate 24. The circuit board 22 includes a plurality of components 26, such as various types of integrated circuits. In general, circuit pack 20 may contain electronic circuitry, optical components, or both in accordance with the functions performed by the circuit pack.

The enclosure 10 includes a plurality of chambers 28 each disposed to receive a circuit pack. The chamber 28 is defined by two adjacent sidewalls 14, and the portions of the bottom wall 12, the top cover 16, and the rear wall 18 generally between the two adjacent sidewalls. A circuit pack is typically inserted into a chamber through the front opening of the chamber defined by the front edges of the bottom wall 12 and top cover 16, and front edges of the adjacent sidewalls 14. The circuit pack 20 is preferably designed to form an RF tight seal between its front panel or faceplate 24 and the front edges of the chamber when the circuit pack is seated in its operating position within the enclosure. In general, each chamber is designed to provide a substantially RF tight seal in order to contain any RF radiation that may be emitted from components on the circuit pack. Thus, each of the chambers forms a substantially RF tight compartment when a circuit pack is installed. This serves to isolate the RF radiation associated with each circuit pack so that undesired RF radiation from one circuit pack does not adversely affect another circuit pack or be radiated into the environment external to the enclosure.

Figure 2:
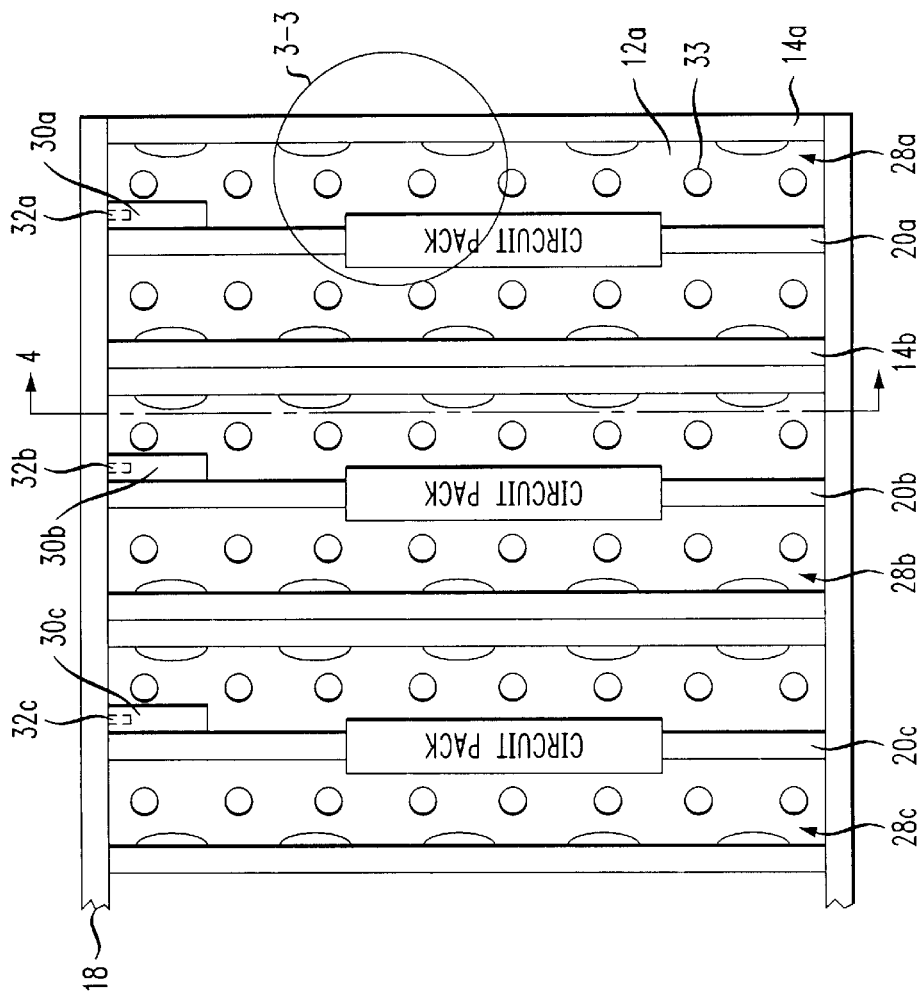
FIG. 2 is a partial top cross-sectional view of the enclosure of FIG. 1.

Referring to FIG. 2, a partial top view of the enclosure 10 is shown with the top cover removed for clarity. In this view, the enclosure 10 is shown with a plurality of circuit packs 20a, 20b, and 20c installed in chambers 28a, 28b, and 28c, respectively. The circuit packs 20a, 20b, and 20c have connectors 30a, 30b, and 30c which engage respective sets of pins 32a, 32b, and 32c on backplane 18. The rear wall 18 preferably comprises a backplane, which provides connectivity between the circuit packs and equipment external to the enclosure.

Since each of the chambers is substantially identical, only a single chamber will be described in detail. Chamber 28a includes sidewalls 14a and 14b, a portion 12a of the bottom wall 12, a portion 18a of rear wall 18, and a portion 16a of the top cover 16 (not shown in FIG. 2). A plurality of holes 34 disposed in the portion 12a of the bottom wall 12 on each side of the circuit pack 20a provide an example of a means for accepting a fluid, such as air, into the chamber in order to provide cooling of the components on the circuit pack. Preferably, a source of pressurized air external to the enclosure forces air into the chamber through the holes 34. One example of providing cooled air would be to utilize the Joule-Thompson effect where pressurized air is allowed to expand upon passing through holes 34 into the chamber. Alternatively, one or more conventional fans could be used to force air into the chamber. As will be explained in greater detail with reference to FIG. 4, the air exits through portion 16a of the top cover. Preferably, the air enters along the bottom of the circuit pack and along each of the surfaces of the circuit pack to create airflow over a substantial portion of the total area of the circuit pack as the air exits through the top cover along the top edge of the circuit pack. Of course, a liquid fluid could be utilized to provide an even greater rate of cooling should the circuit pack require more heat dissipation than could be provided by the use of conventional heat sinks and air-cooling.

It is desired to not only provide an RF tight chamber 28a to reduce RF emissions outside of the enclosure, but to also minimize the amount of RF energy within the chamber. As shown in FIGS. 2 and 3, the sidewalls 14a and 14b preferably include a plurality of protrusions or bumps 34 which extend toward the circuit pack 20a from the interior surfaces of the sidewalls in chamber 28a. The bumps and the spaces between the bumps define hills and valleys intended to disrupt and disburse RF energy reflections. As best seen in FIG. 3, RF radiation emitted from circuit pack 20a as represented by arrows 36 strike the bumps 34 and is reflected at various angles and directions. This tends to disrupt reflected RF radiation as compared with a reflection from a relatively planar surface. The bumps preferably have surfaces that are contoured to present varying angles of reflection to RF energy radiated by the circuit pack. In one embodiment the bumps are of various sizes and spacing in order to provide a disruptive surface to radiated RF energy over a variety of frequencies.

In addition to disrupting reflected RF radiation patterns, it is desirable to reduce the level of reflected RF radiation. In one preferred arrangement, at least the bumps 34 absorb a substantial part of the incident RF radiation and reflect only the part of the RF radiation that was not absorbed by the bump. This can be accomplished by either forming the bumps out of an RF absorbent material or by coating the surfaces of the bumps exposed to the RF radiation with an RF absorbent material. In a further arrangement, substantially all of the interior surfaces of the sidewalls of each chamber absorb RF energy. In still a further arrangement, substantially all of the interior surfaces of the chamber absorb RF energy including the sidewalls 14a, 14b, and bumps 34 thereon, the bottom wall 12a, the top cover 16a (not shown in FIG. 2), and the faceplate 24 of circuit pack 20a. If the circuit packs are designed without a faceplate or with one that cannot form a tight RF seal, a separate cover plate or door could be used to provide an RF barrier at the front of the chambers. In that case, its interior surfaces that face the chambers preferably are RF absorbent. Even the interior surface of the rear wall 18 could be absorbent of RF radiation. If the rear wall consists of a conventional backplane used to conduct signals to and from the circuit pack, the electrical conductors, if any, on the interior surface of the backplane could be protected by the use of electrical insulator placed between the conductors and an RF absorbent material. The holes 34 are preferably sized to be small relative to the wavelength of the highest frequency of concern; for example, the diameter of the holes could be less than $\frac{1}{10}$ the wavelength of the highest frequency of interest in order to substantially impede RF radiation.

Figure 4:
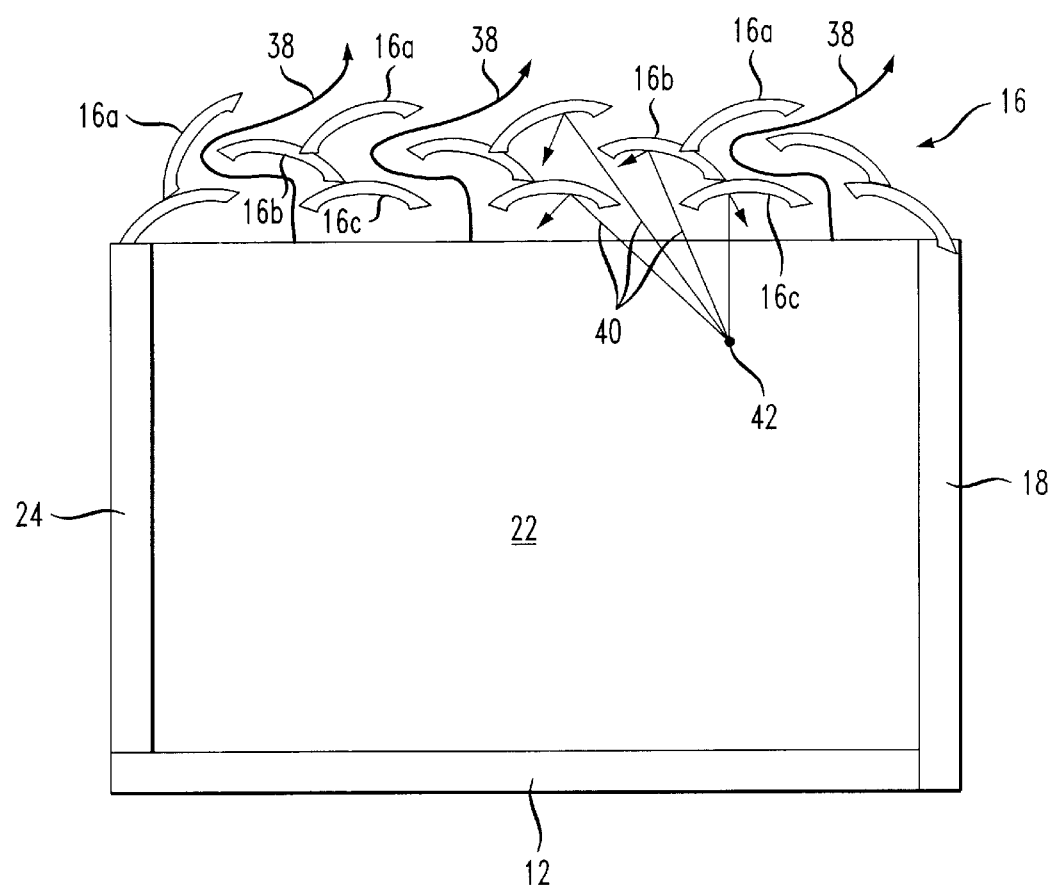
FIG. 4 is a cross-sectional view along line 4—4 of FIG. 2.

FIG. 4 shows a side view taken along line 4—4 of FIG. 2 and best illustrates an exemplary configuration of the top cover 16. In this embodiment top cover 16 includes an interleaved series of baffle walls 16a, 16b, and 16c. Arrows 38 mark passageways that permit the substantially unobstructed flow of the cooling fluid from the interior of the chamber. Although the cooling fluid can easily exit the chamber through these passageways, radiated RF energy from the circuit pack within the chamber finds no direct line of sight path. Arrows 40 represent the RF radiation from a source of radiation 42 on the circuit pack. As illustrated, such RF radiation cannot escape through the baffle walls of the top cover without first encountering at least two different reflections from surfaces of the baffle walls. Preferably, all surfaces of the baffle walls that can encounter direct or reflected RF energy are made of or coated with an RF absorbent material. Thus, RF radiation cannot escape through the passageways of the baffle walls without first being substantially attenuated. The baffle walls are preferably curved to increase the number of reflections that RF energy will have to encounter before exiting through a passageway. The baffle walls provide an example of a means that allows the cooling fluid in the chamber to escape while resisting the transmission of RF energy from the circuit pack in the chamber to the environment external to the enclosure.

The top cover 16 preferably forms a contiguous RF seal with the top edges of the sidewalls to prevent radiated RF energy from traversing from one chamber to an adjacent chamber. This can be accomplished through a variety of designs. For example, strips of resilient material that are also RF absorbent can be placed along the top edges of the sidewalls to engage with and deform into the baffle walls of the top cover to form an RF barrier. In another arrangement, the baffle could comprise a series of rectangular sheets of baffle walls with the width being substantially the distance between adjacent sidewalls, and wherein each sheet is supported between conventional solid walls that extend beyond the baffle walls and are dimensioned to contiguously engage the upper edges of the sidewalls. Generally the baffle presents a top cap for each chamber while forming RF tight seals along the top edges of the sidewalls.

Although embodiments of the present invention have been described above and shown in the accompanying drawings, those skilled in the art can make various modifications and changes to the embodiments without departing from the scope of the invention as defined by the claims that follow.

I claim:

1. An enclosure for housing electronic circuit packs, the enclosure providing radio frequency (RF) isolation among the installed circuit packs and relative to the external environment, the enclosure comprising:
   a plurality of spaced apart sidewalls;
   a bottom wall, rear wall, and top cover each forming an RF tight seal with the sidewalls and defining separate chambers adapted to accept circuit packs, each chamber comprising a first and second sidewall, and portions of the bottom wall, rear wall, and top cover;
   the first and second sidewalls, bottom wall, and top cover of each chamber being configured to form an RF tight seal around an installed circuit pack;
   a connector disposed in each chamber that engages an installed circuit pack to provide a communication path between the installed circuit pack and equipment external to the chamber;
   means for accepting a fluid into each of said chambers and a means for allowing fluid in each chamber to escape from the chamber, the allowing means being disposed relative to the accepting means such that the fluid flows within the chamber adjacent a substantial portion of at least one surface area of the installed circuit pack to cool components on the installed circuit pack, the accepting means and the allowing means being resistant to the transmission of RF energy radiating from the installed circuit pack;
   at least portions of surfaces of the first and second sidewall that are interior to a chamber being able to absorb the RF energy radiating from the enclosed circuit pack in order to minimize reflections of the radiated RF energy.

2. The enclosure according to claim 1 wherein the portions of the bottom wall that form part of the chambers are able to absorb a substantial portion of the RF energy radiating from the enclosed circuit packs in order to minimize reflection of the radiated RF energy.

3. The enclosure according to claim 1 wherein the portions of the top cover that form part of the chambers are able to absorb a substantial portion of the RF energy radiating from the enclosed circuit packs in order to minimize reflection of the radiated RF energy.

4. The enclosure according to claim 1 wherein the portions of the rear wall that form part of the chambers are able to absorb a substantial portion of the RF energy radiating from the enclosed circuit packs in order to minimize reflection of the radiated RF energy.

5. The enclosure according to claim 1 wherein the portions of at least two of the bottom wall, rear wall, and the top cover that form part of the chambers are able to absorb a substantial portion of the RF energy radiating from the endosed circuit packs in order to minimize reflection of the radiated RF energy.

6. The enclosure according to claim 1 wherein the allowing means comprises a baffle for each chamber disposed in one of the bottom wall and top cover in the portion of said one that resides generally between the first and second sidewall, the baffle designed to provide an escape path for exiting fluid that offers low resistance to the flow of fluid while simultaneously providing no line of sight path between the interior of the chamber and the external environment.

7. The enclosure according to claim 6 wherein the baffle includes internal surfaces disposed generally towards the chamber, the internal surfaces of the baffle are designed to absorb a substantial portion of the RF energy striking the internal surfaces of the baffle.

8. The enclosure according to claim 7 wherein the baffle comprises a series of walls arranged to define an offset passage for the flow of the fluid, the offset passage not presenting a line of sight passage to RF energy within the chamber.

9. The enclosure according to claim 8 wherein the baffle walls are curved and interleaved to direct any reflected RF energy off said baffle walls back into the chamber or towards another surface of said baffle walls.

10. The enclosure according to claim 9 wherein all surfaces of the baffle walls susceptible of being stricken directly or indirectly by RF energy originating in the chamber are designed to absorb a substantial portion of the RF energy.

11. The enclosure according to claim 6 wherein the accepting means comprises a series of apertures in the other of the bottom wall and top cover in the portion of said other that resides generally between the first and second sidewall, the apertures sized sufficiently smaller than the wavelength of RF energy being radiated by the circuit pack so as to inhibit the passage of RF energy through the apertures.

12. The enclosure according to claim 11 wherein the series of apertures comprise holes that facilitates cooling via Joule-Thomson effect.

13. The enclosure according to claim 11 wherein the baffle is disposed in the top cover and the apertures reside in the bottom wall.

14. The enclosure according to claim 1 wherein the rear wall is a backplane and the connectors in each chamber comprise sets of electrical connectors arranged along the backplane disposed to engage each circuit pack.

15. The enclosure according to claim 1 wherein said interior surfaces of the first and second sidewall comprise a RF absorbing material and have a plurality of bumps that define hills and valleys from the perspective of the circuit pack.

16. The enclosure according to claim 15 wherein said bumps have surfaces that are contoured to present varying angles of reflection to RF energy radiated by the circuit pack.

17. An enclosure for housing electronic circuit packs that provides radio frequency (RF) isolation among the installed circuit packs and relative to external environment, the enclosure comprising:
   a plurality of spaced apart sidewalls;
   a bottom wall, rear wall, and top cover each forming an RF tight seal with the sidewalls and defining separate chambers for at least some of the installed circuit packs, each chamber comprising a first and second sidewall, and portions of the bottom wall, rear wall, and top cover, the portions of the bottom wall and the top cover that form part of the chambers are able to absorb a substantial portion of the RF energy radiating from the enclosed circuit packs in order to minimize reflection of the radiated RF energy;
   the first and second sidewalls, bottom wall, and top cover of each chamber being configured to form an RF tight seal with a faceplate of an installed circuit pack;
   a connector disposed in each chamber that engages an installed circuit pack to provide a communication path between the installed circuit pack and equipment external to the chamber, the rear wall being a backplane and the connectors in each chamber comprising sets of electrical connectors arranged along the backplane disposed to engage each circuit pack;
   means for accepting a fluid into each of said chambers and a means for allowing fluid in each chamber to escape from the chamber, the allowing means being disposed relative to the accepting means such that the fluid flows within the chamber adjacent a substantial portion of the surface area of the installed circuit pack in order to cool components on the installed circuit pack, the accepting means and the allowing means being resistant to the transmission of RF energy radiating from the installed circuit pack, the allowing means including a baffle for each chamber disposed in the top cover, the baffle designed to provide an escape path for exiting fluid that offers low resistance to the flow of fluid while simultaneously providing no line of sight path between the interior of the chamber and the external environment, internal surfaces of the baffle being designed to absorb a substantial portion of the RF energy striking the internal surfaces of the baffle, the baffle having a series of walls arranged to define an offset passage for the flow of the fluid, the offset passage not presenting a line of sight passage to RF energy within the chamber;

surfaces of the first and second sidewall that are interior to a chamber being able to absorb a substantial portion of the RF energy radiating from the enclosed circuit pack in order to minimize reflection of the radiated RF energy, the interior surfaces of the first and second sidewall comprising an RF absorbing material and configured to have a plurality of bumps that define hills and valleys from the perspective of the circuit pack.

18. An apparatus that contains electronic circuit packs and provides radio frequency (RF) isolation among the circuit packs and relative to the external environment, the apparatus comprising:

a plurality of spaced apart sidewalls;

a bottom wall, rear wall, and top cover each forming an RF tight seal with the sidewalls and defining separate chambers for installed circuit packs, each chamber comprising a first and second sidewall, and portions of the bottom wall, rear wall, and top cover;

a plurality of circuit packs disposed within said chambers, each circuit pack having a faceplate;

the first and second sidewalls, bottom wall, and top cover of each chamber being configured to form an RF tight seal with the faceplate of the circuit pack;

a connector disposed in each chamber that engages the circuit pack to provide a communication path between the installed circuit pack and equipment external to the chamber;

means for accepting a fluid into each of said chambers and a means for allowing fluid in each chamber to escape from the chamber, the allowing means being disposed relative to the accepting means such that the fluid flows within the chamber adjacent a substantial portion of the surface area of the circuit pack in order to cool components on the circuit pack, the accepting means and the allowing means being resistant to the transmission of RF energy radiating from the circuit pack;

surfaces of the first and second sidewall that are interior to a chamber being able to absorb a substantial portion of the RF energy radiating from the circuit pack in order to minimize reflection of the radiated RF energy.

* * * * *